United States Patent
Boerstler et al.

(10) Patent No.: US 7,589,575 B2
(45) Date of Patent: Sep. 15, 2009

(54) PRECISION INTEGRATED PHASE LOCK LOOP CIRCUIT LOOP FILTER

(75) Inventors: David William Boerstler, Round Rock, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 11/877,710

(22) Filed: Oct. 24, 2007

(65) Prior Publication Data
US 2009/0108889 A1    Apr. 30, 2009

(51) Int. Cl.
*H03L 7/06* (2006.01)
(52) U.S. Cl. .................... 327/156; 327/311; 327/552; 375/375
(58) Field of Classification Search ......... 327/156–159, 327/309, 311–313, 530–532, 535, 537, 551, 327/552, 555; 331/18, 19, 25, 32, 34; 375/373–376
See application file for complete search history.

(56) References Cited

U.S. PATENT DOCUMENTS

| | | |
|---|---|---|
| 4,868,482 A | 9/1989 | O'Shaughnessy et al. |
| 7,102,200 B2 | 9/2006 | Fan et al. |
| 2002/0125928 A1 * | 9/2002 | Isobe et al. .............. 327/158 |
| 2002/0135424 A1 * | 9/2002 | Oikawa ................. 330/288 |
| 2004/0108905 A1 | 6/2004 | Mason |

* cited by examiner

*Primary Examiner*—Long Nguyen
*Assistant Examiner*—Shikha Goyal
(74) *Attorney, Agent, or Firm*—Yee & Associates, P.C.; Matthew B. Talpis

(57) ABSTRACT

A loop filter in a phase lock loop circuit comprising a reference precision resistor, a first FET and a second FET, wherein the gate of the first FET is tied to the gate of the second FET, and a filter capacitor connected to the first FET for producing a capacitor voltage. The capacitor voltage is applied to the source of the first FET, the source of the second FET, and to the bottom of the reference precision resistor acting as a virtual ground. The capacitor voltage generated by the filter capacitor sets the bias point of the second FET such that the second FET comprises characteristics of an integrated precision resistor. A predetermined voltage generated by the second FET is applied to the gate of the first FET to set the bias point of the first FET such that the first FET comprises characteristics of an integrated precision resistor.

20 Claims, 4 Drawing Sheets

PRECISION INTEGRATED PHASE LOCK LOOP CIRCUIT LOOP FILTER

BACKGROUND OF THE INVENTION

1. Field of the Invention

The present invention relates generally to integrated circuits, and in particular to actively biasing field effect transistors in a loop filter in an integrated phase lock loop circuit to form precision integrated resistors having a reduced area and improved high frequency capability.

2. Description of the Related Art

An integrated circuit is a collection of electronic components fabricated within a semiconductor device or chip. One such electronic component is a resistor. A resistor limits or regulates the flow of electrical current in an electronic circuit under specified conditions. Integrated resistors in digital complementary metal-oxide-semiconductor (CMOS) processes often have tight tolerances in their resistance characteristics, which are extremely important for analog and input/output (I/O) circuits. To provide stability in these circuits, precision resistors are required to have a small variation in resistance values, such that the resistor does not operate beyond an allowed temperature range.

Another electronic component in an integrated circuit is a transistor. A transistor regulates current or voltage flow and acts as a switch or gate for electronic signals. One common type of transistor is a field effect transistor (FET). FETs in digital complementary metal-oxide-semiconductor (CMOS) processes typically have looser tolerances in their characteristics (e.g., ~30-40% Ieff variation, temperature coefficient of delay effects of 1000's ppm/deg C.) than precision resistors (e.g., ~5-15% resistivity, temperature coefficient of resistance of 100's ppm/deg C).

FIG. 1 illustrates an example of an equivalent circuit for an integrated precision resistor. Precision resistor circuit 100 comprises two resistors R1 102 and R2 104, and three capacitors C1 106, C2 108, and C3 110. Conventional precision resistors such as contained in precision resistor circuit 100 often have undesirable characteristics. These characteristics include large area dimensions (meaning that the resistor takes up a large area of the chip) and high capacitance, both of which limit a precision resistor's usefulness for circuits requiring very large resistor values, large numbers of resistors, or high frequency response. Precision resistors also require additional mask steps beyond those required for FETs, thereby adding complexity and cost for applications that require on-chip resistors. In contrast, FETs have the advantage of being extremely small and therefore have very good properties for high frequency operation. However, the variability in the FET behavior due to process technology generally restricts FETs from precision analog applications.

SUMMARY OF THE INVENTION

The illustrative embodiments provide a method and system for actively biasing field effect transistors in a loop filter in an integrated phase lock loop circuit to form precision integrated resistors having a reduced area and improved high frequency capability. The loop filter in the phase lock loop circuit comprises a reference precision resistor, a first field effect transistor and a second field effect transistor, wherein the gate of the first field effect transistor is tied to the gate of the second field effect transistor, and a filter capacitor connected to the first field effect transistor for producing a capacitor voltage. The capacitor voltage is applied to the source of the first field effect transistor, the source of the second field effect transistor, and to a bottom of the reference precision resistor acting as a virtual ground. The capacitor voltage generated by the filter capacitor sets the bias point of the second field effect transistor such that the second field effect transistor comprises characteristics of an integrated precision resistor. In addition, a predetermined voltage generated by the second field effect transistor is applied to the gate of the first field effect transistor to set the bias point of the first field effect transistor such that the first field effect transistor comprises characteristics of an integrated precision resistor.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
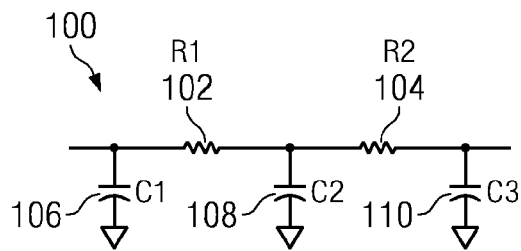
FIG. 1 is a diagram of a known integrated precision resistor equivalent circuit.

The illustrative embodiments provide a method and system for creating a precision integrated resistor by biasing field effect transistors (FETs) in a CMOS process. The illustrative embodiments may be used in circuit designs which either do not have a resistor technology available, or the resistor process is eliminated to reduce cost. The illustrative embodiments actively bias a master field effect transistor in an integrated phase lock loop circuit to enable the field effect transistor to have the same characteristics as a precision resistor. Biasing is the process of applying a predetermined voltage to a circuit to set an appropriate direct current (DC) operating point. The biasing of the master field effect transistor may then be used to control one or more other slave field effect transistors which are matched to the master. The slave field effect transistors may have an identical length and channel width as the master field effect transistors, or the slave field effect transistors may be related by some proportion. With the illustrative embodiments, both of the master and slave field effect transistors will have the same direct current and thermal characteristics as a reference integrated precision resistor in the circuit, but the master and slave field effect transistors will have a reduced area and improved high frequency capability.

In particular, the illustrative embodiments provide a phase lock loop circuit comprising a precision FET resistor within a loop filter. In conventional loop filters that have resistor technology, the parasitic capacitance of the resistor can significantly change the performance of the phase lock loop circuit. The resistor technology in a conventional loop filter can contribute to higher jitter, mistracking, or instability of the circuit. In conventional loop filters that do not have resistor technology, the loop filter design must include some other means of creating a zero in the closed loop response. A zero in the response results from having no overshoot or no peak in the closed loop response to ensure stable operation. This requirement can add complexity to the design and may have other significant process sensitivities. The loop filter in the phase lock loop circuit of the illustrative embodiments solves these problems by biasing a master FET in the loop filter to operate as a precision FET resistor. The precision FET resistor is then used to set the DC operating or bias point of a slave FET in series with a filter capacitor with arbitrary voltage Vcap. The arbitrary voltage Vcap is buffered with a high input impedance, high gain, and low output impedance operational amplifier to create a voltage Vbuf which has virtually the same potential as arbitrary voltage Vcap. Since the operational amplifier has a low output impedance and low input offset voltage, the node Vbuf acts as a virtual ground for the precision FET resistor. The gate to source voltage Vgs of the precision FET resistor and the slave FET are virtually the same.

The resistance of a resistor may depend upon the size of the resistor. Creating precision FET resistors for use in a loop filter in a phase lock loop circuit allows for achieving high precision in a smaller area on the chip in contrast with conventional resistors which have large-area dimensions or take up a large chip area. In addition, using precision FET resistors in a loop filter instead of using an integrated resistor allows for achieving low capacitance, since capacitance is one of the limitations of using an on-chip resistor. The precision FET resistors in the loop filter also allow for obtaining looser tolerances of resistivity and temperature. These looser tolerances are advantageous since large variations in resistivity and temperature of a conventional integrated resistor can make or break the integrated circuit design. The loop filter in the illustrative embodiments may also be employed in a CMOS process which does not have any resistors, as the loop filter creates resistors using the field effect transistors.

Figure 2A:
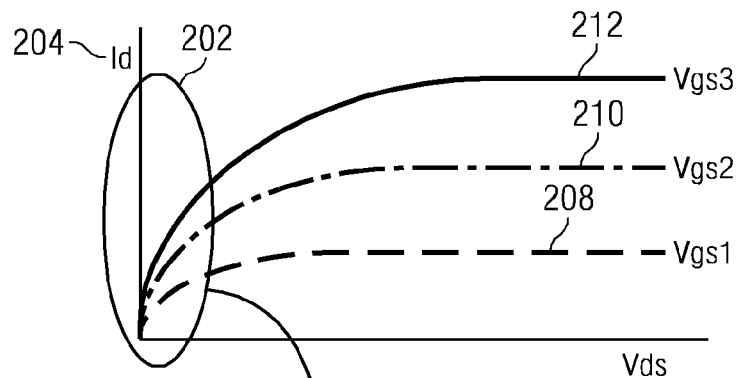
FIGS. 2A and 2B are graphs illustrating field effect transistor triode characteristics.
Figure 2B:
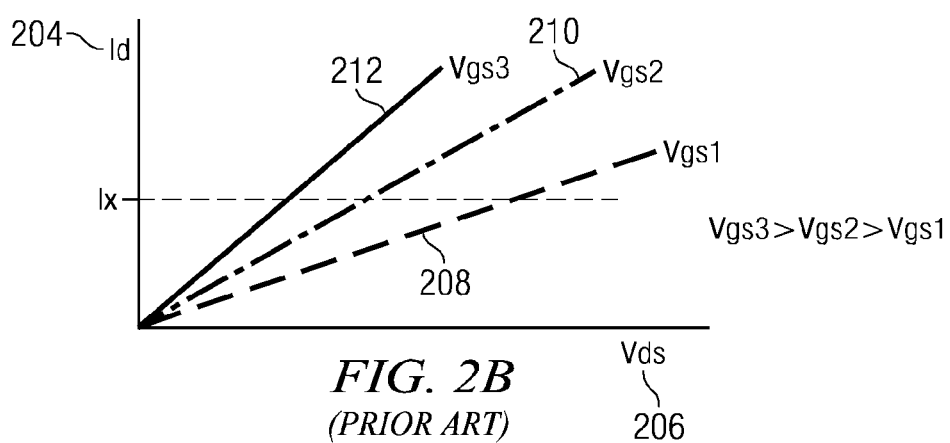

Turning now to the Figures, FIGS. 2A and 2B are graphs illustrating known triode characteristics of a field effect transistor. In particular, FIGS. 2A and 2B show the behavior of a field effect transistor in the "linear" or triode region of operation. It is well known that when operating the transistor in the triode region of operation 202, the transistor may exhibit characteristics of a resistor. The triode region of operation 202 is the region in which the value of the drain to source voltage (Vds) is less than the value of the gate voltage (Vgs) minus the threshold voltage (Vt) (not shown) of the transistor, or Vds<Vgs−Vt. Vt represents the voltage at which the field effect transistor begins to turn on. The vertical axis of the graph represents the drain current (Id) 204 supplied to the transistor, and the horizontal axis of the graph represents the drain to source voltage (Vds) 206 of the transistor. When a transistor is operating in the triode region 202, each gate voltage (Vgs1 208, Vgs2 210, Vgs3 212, where Vgs3>Vgs2>Vgs1) has a linear relationship with the current (Id 204) supplied to the transistor.

FIG. 2B illustrates the linear relationship of gate voltage (Vgs1 208, Vgs2 210, Vgs3 212) with the drain current (Id 204) when the transistor is operating in the triode region 202 in FIG. 2A. Since the transistor is operating in the triode region, the transistor exhibits characteristics of a resistor. The resulting resistance of the transistor may be modulated by changing the value of the gate voltage (Vgs1 208, Vgs2 210, or Vgs3 212), specifically when the drain to source voltage Vds 206 is low (Vds<<Vgs−Vt).

Figure 3:
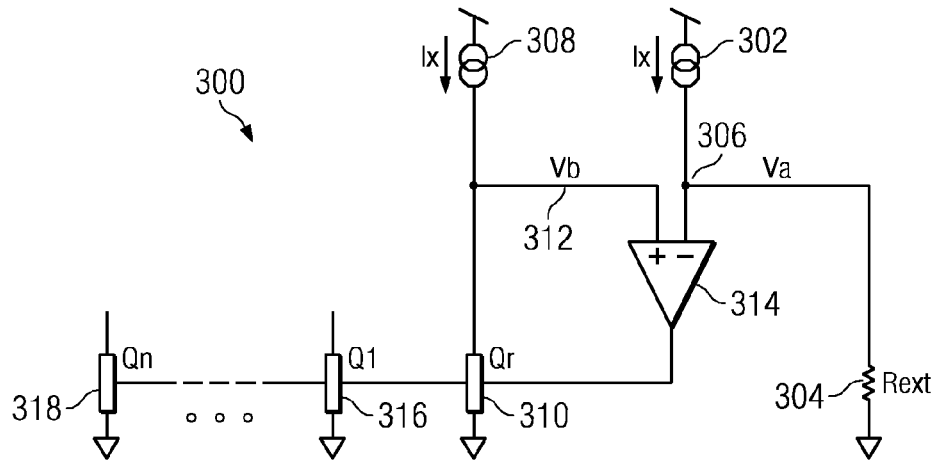
FIG. 3 is a diagram of a known precision field effect transistor resistor circuit.

FIG. 3 is a diagram of a known precision FET resistor circuit. In FIG. 3, a master field effect transistor is shown to be biased in such a manner as to have the same characteristics as a precision integrated resistor. In addition, the bias is also used to control one or more other slave field effect transistors which are matched to the master field effect transistor. An example of known precision FET resistor circuit is described in U.S. Pat. No. 4,868,482 entitled "CMOS Integrated Circuit Having Precision Resistor Elements", issued Sep. 19, 1989.

Circuit 300 comprises a current source which supplies a reference current Ix 302 to external resistor Rext 304 to produce reference voltage Va 306. A separate current source Ix 308 is matched to reference current Ix 302 and supplies a current to the drain of transistor Qr 310. Transistor Qr 310 produces voltage Vb 312 at the drain. High-gain operational amplifier (opamp) 314 is used to provide negative feedback to the gate of Qr 310 so that reference voltage Va 306 equals voltage Vb 312 and the effective drain to source resistance of transistor Qr 310 will be equal to the value of external resistor Rext 304.

Circuit 300 also comprises multiple transistors Q1 316 to Qn 318. As multiple transistors Q1 316 to Qn 318 have gates connected to gate of transistor Qr 310, multiple transistors Q1 316 to Qn 318 are driven by operational amplifier (opamp) 314. The gate lengths and channel widths of the transistors Q1 316 to Qn 318 may be identical to the gate length and channel width of transistor Qr 310, or the gate lengths and channel widths of transistors Q1 316 to Qn 318 may be related to the gate length and channel width of the transistor Qr 310 in some proportion. Consequently, the resistance values of transistors Q1 316 to Qn 318 may be precisely controlled to be equal to, or any multiple or sub-multiple of, the resistance of transistor Qr 310. Thus, both transistor Qr 310 and transistors Q1 316 to Qn 318 may have the same characteristics as a precision integrated resistor.

Figure 4:
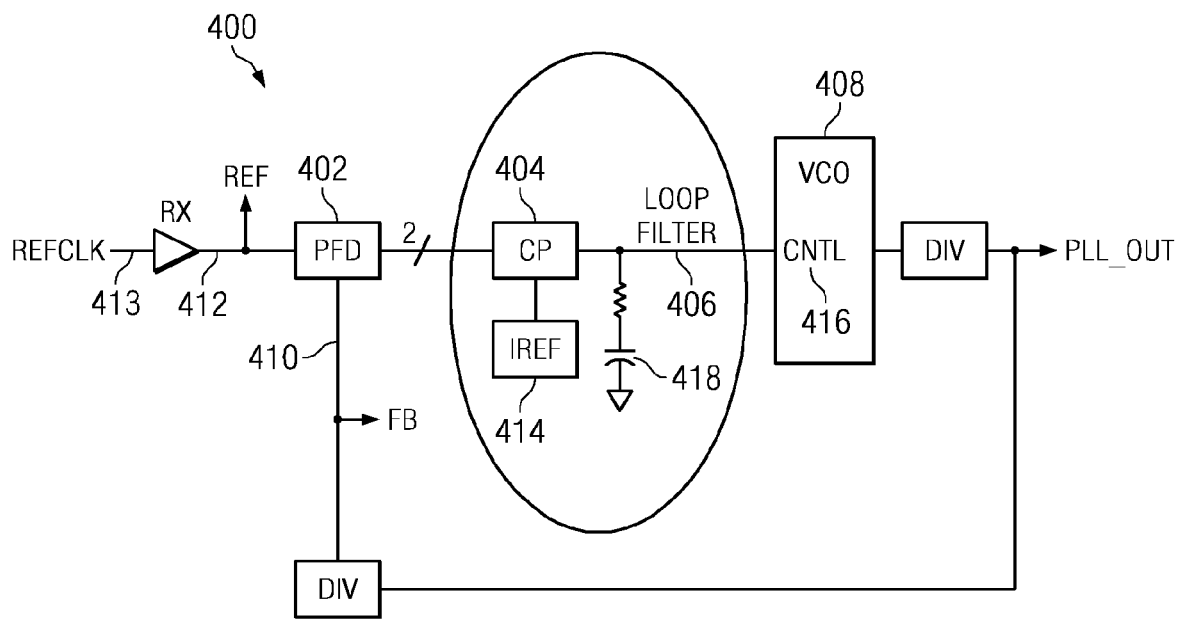
FIG. 4 is a diagram of a known phase lock loop circuit.

FIG. 4 is a diagram of a known phase lock loop (PLL) circuit. A phase lock loop (PLL) is a circuit that generates a signal that is locked to the frequency of an input or "reference" signal. The circuit compares an output signal generated by an oscillator to the reference signal and automatically raises or lowers the frequency of the output signal until the phase of the output signal is synchronized or matched to the phase of the reference signal. Phase lock loops are used for a variety of synchronization purposes, including signal demodulation, frequency synthesis, and recovery of signals. In this illustrative example, conventional phase lock loop circuit 400 is an analog phase lock loop comprising a phase frequency detector (PFD) 402, charge pump 404, loop filter 406, and voltage controlled oscillator (VCO) 408.

Phase frequency detector (PFD) 402 determines whether the feedback output signal 410 (generated in phase lock loop circuit 400 and fed back to phase frequency detector (PFD) 402) and the reference signal 412 (from refclk 413) are out of phase. If the frequency difference between the feedback output signal and the reference signal is too large, the frequency of the feedback output signal cannot lock to the frequency of the reference signal. Consequently, phase frequency detector (PFD) 402 outputs a corrective control signal 416 to control the oscillator and adjust the frequency of the feedback output signal to synchronize the clock signals, thereby causing the phase between the feedback output signal and the reference signal to become zero. The frequency of the feedback output signal is then able to lock to the frequency of the reference signal.

Charge pump 404 generates current using input voltage signals from a current reference circuit (IREF 414). These voltage signals are adjusted based on the phase and frequency relationship between reference signal 412 and feedback output signal 410. For example, phase frequency detector (PFD) 402 directs charge pump 404 to change the IREF 414 voltage signals to speed up voltage controlled oscillator 408 if feedback output signal 410 lags behind reference signal 412. In contrast, phase frequency detector (PFD) 402 directs charge pump 404 to change the IREF 414 voltage signals to slow down voltage controlled oscillator 408 if feedback output signal 410 moves ahead of reference signal 412.

Voltage controlled oscillator 408 varies its frequency in response to a control voltage from charge pump 404. Voltage controlled oscillator 408 produces an output signal of phase lock loop circuit 400. The output signal feeds back into phase frequency detector (PFD) 402. Phase frequency detector (PFD) 402, charge pump 404, loop filter 406, and voltage controlled oscillator (VCO) 408 operate together to enable feedback output signal 410 to eventually synchronize with reference signal 412 input to phase lock loop circuit 400.

Loop filter 406 is provided with a control signal from phase frequency detector (PFD) 402. The control signal is provided to loop filter 406 when phase frequency detector (PFD) 402 compares the frequency of feedback output signal 410 to reference clock signal 412. Typically, loop filter 406 is a low-pass filter connected to filter capacitor 418. The low-pass filter is arranged in such a manner as to smooth out the abrupt control inputs from charge pump 404. Thus, loop filter 406 receives a control signal from phase frequency detector (PFD) 402 and provides a smoothed or averaged control signal 416 to voltage controlled oscillator 408.

In this example of a conventional phase lock loop circuit, charge-pump 404, loop filter 406, current reference circuit IREF 414, and filter capacitor 418 are circled. If the CMOS process has a resistor technology available, loop filter 406 can be implemented as illustrated. However, with conventional phase lock loop circuits, the parasitic capacitance of the resistor can significantly change the performance of the phase lock loop and can contribute to higher jitter, mistracking, or instability. If the CMOS process does not have a suitable resistor technology, the phase lock loop circuit design must include some other means of creating a zero between the feedback output signal and the reference signal (e.g., feedforward), which adds complexity and which may have other significant process sensitivities.

Figure 5:
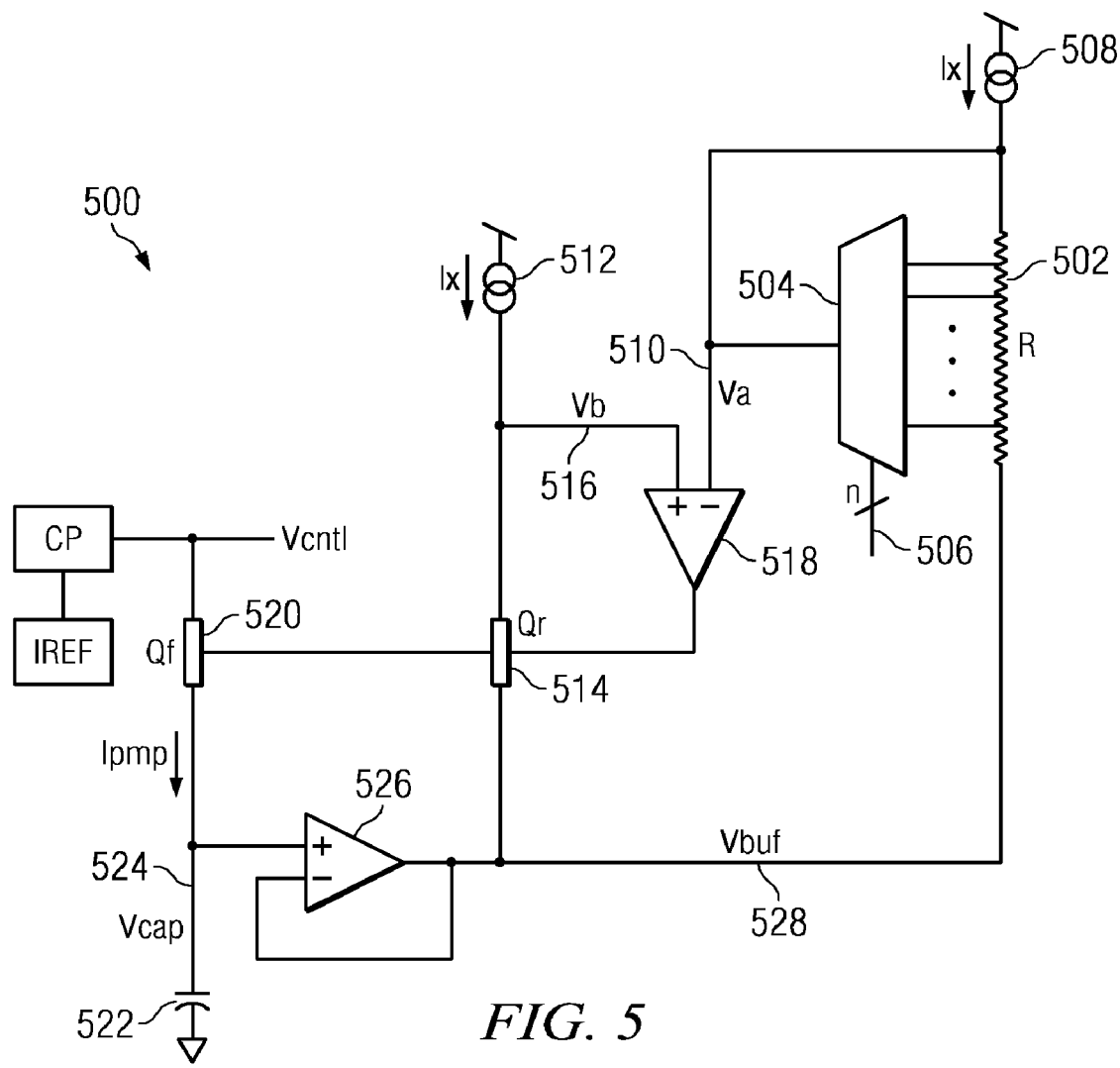
FIG. 5 is a diagram of a loop filter with precision resistors in a phase lock loop circuit in accordance with the illustrative embodiments.

FIG. 5 is a diagram of an example phase lock loop (PLL) loop filter with precision resistors in accordance with the illustrative embodiments. PLL loop filter 500 illustrates how field effect transistors may operate as precision resistors to allow adequate resistance matching even for large reference resistance values in the phase lock loop circuit. Using PLL loop filter 500 accomplishes the desired features of allowing large values of resistance to be achieved in a small area of the phase lock loop circuit design, while allowing for better frequency precision and accuracy. PLL loop filter 500 is used in place of conventional loop filter 406 in FIG. 4.

In the biasing network of PLL loop filter 500, resistor R 502 is a reference precision resistor. Reference precision resistor R 502 may be adjusted using multiplexer (MUX) 504 controlled by n bits 506. A current source supplies a reference current Ix 508 to reference precision resistor R 502 to produce reference voltage Va 510. Although an internal reference precision resistor R 502 is shown in PLL loop filter 500, in an alternative embodiment, an external reference precision resistor may be used to provide a reference voltage Va 510.

A separate current source Ix 512 is matched to reference current Ix 508 and supplies a current to the drain of n-type field effect transistor (NFET) Qr 514. NFET Qr 514 produces voltage Vb 516 at the drain.

High-gain operational amplifier (opamp) 518 is used to provide negative feedback to the gate of NFET Qr 514 so that reference voltage Va 510 equals voltage Vb 516 and the effective drain to source resistance (Rds) of NFET Qr 514 will be equal to the value of reference resistor R 502 selected by multiplexer 504.

The resistance of a resistor is proportional to the length, L, of the resistor and the channel width of the resistor. In one example embodiment, the channel width to length ratio (W/L) of NFET Qr 514 is Wr/Lr. Additional transistors, such as NFET Qf 520, may be connected as a slave device to master precision NFET resistor Qr 514. NFET Qf 520 has a channel width to length ration of Wf/Lf, where Wf/Lf=(Wr/Lr)/N, and where N is a positive real number. In this example, the effective drain to source resistance (Rds) of NFET Qf 520 is N times the value of precision resistor NFET Qr 514. To operate as a precision resistor, the drain of NFET Qf 520 must stay in the triode region, so the drain of NFET Qf 520 is limited to an appropriate voltage range for the device. Likewise, the drain of any additional NFETs connected as a slave device to precision resistor Qr 514 must not exceed a voltage which would move the device out of the triode region.

Thus, PLL loop filter 500 operates to bias NFET Qr 514 in such a manner as to allow the resistance of NFET Qr 514 to be equal to or be some multiple of reference resistor R 502, thereby enabling NFET Qr 514 to operate as a precision resistor in PLL loop filter 500. Any changes in the characteristics of resistor R 502, such as an increase in resistance due to temperature, will cause reference voltage Va 510 to change accordingly. Consequently, PLL loop circuit 500 forces the voltage Vb 516 to track the change to reference voltage Va 510.

In addition, the precision resistor NFET Qr 514 is used to set the DC operating or bias point of NFET Qf 520 such that NFET Qf 520 is in series with filter capacitor 522. Filter capacitor 522 is used to supply an arbitrary voltage Vcap 524 to a high input, high gain, and low output impedance operational amplifier (opamp) 526. Filter capacitor 522 is the same as filter capacitor 418 in FIG. 4.

For the drain to source impedances of NFET Qr 514 and NFET Qf 520 to be equal, their gate-to-source voltages (Vgs) must be equal. Since their gates are already tied together, their sources must be at the same potential for their gate-to-source voltages to be equal. Capacitor voltage Vcap 524 may be virtually any DC value between the supply rails during PLL operation, so opamp 526 is used to duplicate voltage Vcap 524 without disturbing or altering Vcap 524. Voltage Vcap 524 from filter capacitor 522 is buffered with the high input, high gain, and low output impedance operational amplifier 518 to create voltage Vbuf 528. Voltage Vbuf 528 has substantially the same potential as voltage Vcap 524.

Thus, Vbuf 528 equals Vcap 524, and the gate-to-source voltage of NFET Qr 514 equals the gate-to-source voltage of NFET Qf 520, allowing the drain-to-source impedances of NFET Qr 514 and NFET Qf 520 to be equal. Since the drain-to-source voltage of NFET Qr 514 (Vb 516-Vbuf 528) must track and be equal to the voltage across reference precision resistor R 502 (Va 510-Vbuf 528) in order to have the same resistance as reference precision resistor R 502 (accomplished by opamp 518), Vbuf 528 is also applied to the bottom of reference precision resistor R 502. In this manner, capacitor voltage Vcap 524 is used to bias Qr 514, NFET Qf 520, and reference precision resistor R 502, acting as a virtual ground.

Figure 6:
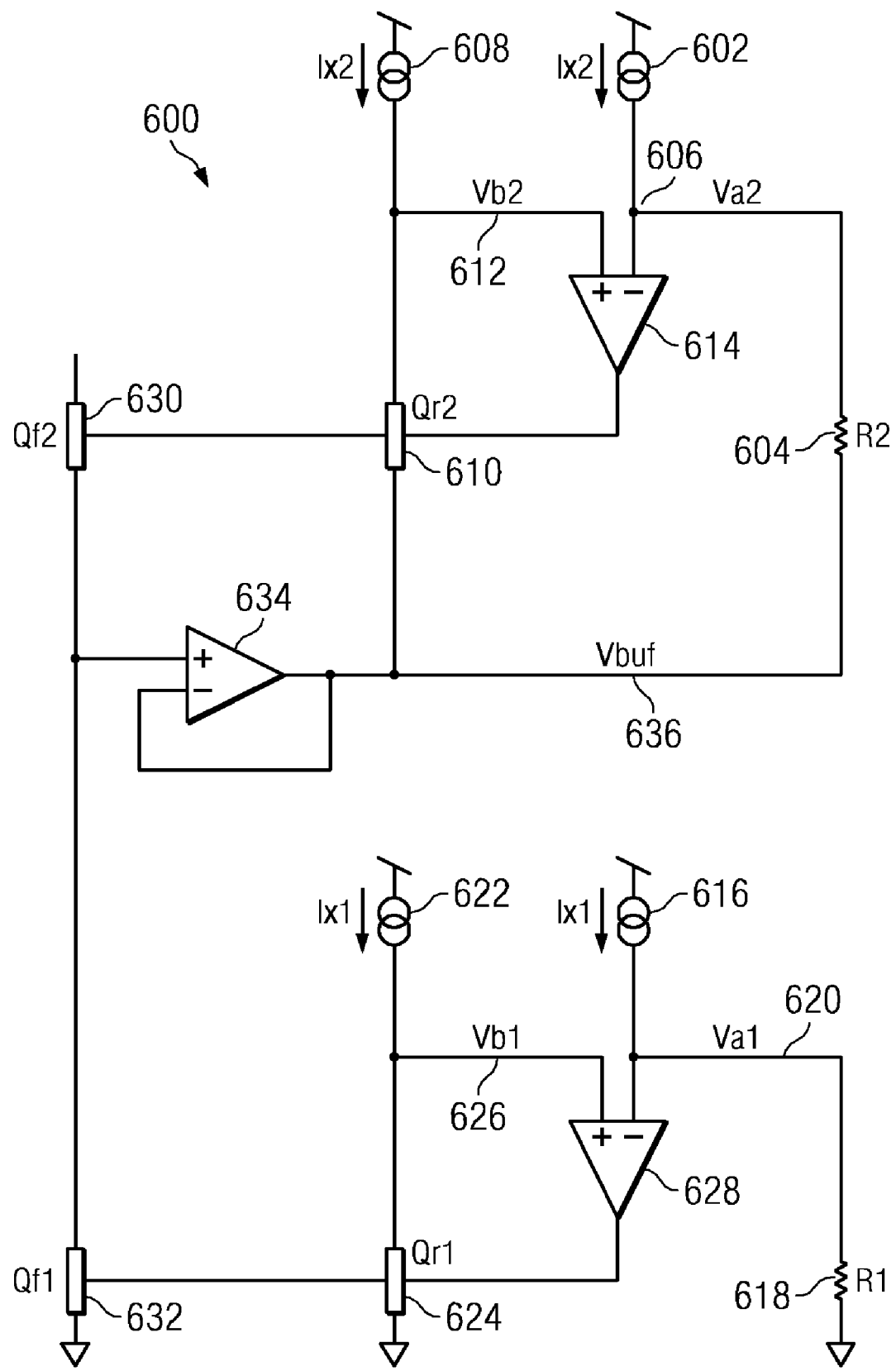
FIG. 6 is a diagram of a loop filter with precision resistors and cascoding in a phase lock loop circuit in accordance with the illustrative embodiments.

FIG. 6 is a diagram of a phase lock loop filter with precision resistors and cascoding in accordance with the illustrative embodiments. In particular, FIG. 6 illustrates how the precision FET resistors may be cascoded so that larger signal swings can be tolerated without having the FETs move out of the triode region of operation. In other words, if a large range of drain to source voltage (Vds) is desired for the circuit, the field effect transistors in the loop filter may be stacked one on top of another (cascoded), thereby extending the range (and thus extending the triode region) over which the drain current (Id) is linear with respect to Vds.

Circuit 600 comprises a current source supplying a reference current Ix2 602 to reference resistor R2 604 to produce reference voltage Va2 606. While reference resistor R2 604 is shown to be on-chip in this example, reference resistor R2 604 may alternatively be off-chip or a multiplexer structure like multiplexer 504 in FIG. 5 may be used. Current source Ix2 608 is matched to reference current Ix2 602 and supplies a current to NFET Qr2 610. NFET Qr2 610 produces voltage Vb2 612 at the drain. High-gain operational amplifier 614 provides negative feedback to NFET Qr2 610 so that reference voltage Va2 606 equals voltage Vb2 612 and the effective drain to source resistance of NFET Qr2 610 will be equal to the value of resistor R2 604.

Likewise, reference current source Ix1 616 is supplied to reference resistor R1 618 to produce reference voltage Va1 620. Current source Ix1 622 is matched to reference current Ix1 616 and supplies a current to NFET Qr1 624. NFET Qr1 624 produces voltage Vb1 626 at the drain. High-gain operational amplifier 628 provides negative feedback to NFET Qr1 624 such that reference voltage Va1 620 equals voltage Vb1 626 and the effective drain to source resistance of NFET Qr1 624 will be equal to the value of resistor R1 618.

NFET Qr2 610 is used to set the DC operating point of NFET Qf2 630. Likewise, NFET Qr1 624 is used to set the DC operating point of NFET Qf1 632. NFET Qf1 632 supplies a voltage to high input, high gain, and low output impedance operational amplifier 634 to create voltage Vbuf 636. As operational amplifier 634 has a low output impedance, Vbuf 636 acts as a virtual ground for precision resistor NFET Qr2 610. Thus, the gate to source voltage (Vgs) of NFET Qr2 610 and NFET Qf2 630 are virtually the same.

The cascoding of NFET Qf2 630 and NFET Qf1 632 extends the range of Vds because NFET Qf1 632 is in the triode region for a small range of voltage 1, and NFET Qf2 630 is in the triode region for a small range of voltage 2. A larger voltage range V3 than either V1 or V2 be themselves is able to be achieved (V3=V1+V2) for the cascoded NFET Qf2 630 and NFET Qf1 632 since the cascoded stage remains in the triode region for V3=V1+V2.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A loop filter in a phase lock loop circuit, the loop filter comprising:
   a reference precision resistor;
   a first field effect transistor and a second field effect transistor, wherein a gate of the first field effect transistor is tied to a gate of the second field effect transistor; and
   a filter capacitor connected to the first field effect transistor for producing a capacitor voltage,
   wherein the capacitor voltage is applied to the source of the first field effect transistor, the source of the second field effect transistor, and to a bottom of the reference precision resistor acting as a virtual ground,
   wherein the capacitor voltage generated by the filter capacitor sets a bias point of the second field effect transistor such that the second field effect transistor comprises characteristics of an integrated precision resistor; and
   wherein a predetermined voltage generated by the second field effect transistor is applied to the gate of the first field effect transistor to set a bias point of the first field effect transistor such that the first field effect transistor comprises characteristics of an integrated precision resistor.

2. The loop filter according to claim 1, wherein the bias point of the first field effect transistor is set such that a drain to source resistance of the first field effect transistor is substantially equal to or is a multiple of a resistance of the reference precision resistor.

3. The loop filter according to claim 1, further comprising:
   a reference current supplied to the reference precision resistor to produce a reference voltage;
   a current supplied to a drain of the second field effect transistor to produce a drain voltage; and
   an operational amplifier for receiving the reference voltage and for providing a negative feedback to the gate of the second field effect transistor so that the drain voltage of the second field effect transistor is substantially equal to the reference voltage;
   wherein a drain to source resistance of the second field effect transistor is substantially equal to or is a multiple of a resistance of the reference precision resistor, and
   wherein the predetermined voltage applied to the gate of the first field effect transistor to set the bias point of the first field effect transistor is a gate voltage of the second field effect transistor.

4. The loop filter according to claim 3, further comprising:
   a second operational amplifier;
   wherein the filter capacitor provides the capacitor voltage to the second operational amplifier to produce a buffered voltage, wherein the buffered voltage has substantially the same potential as the capacitor voltage; and
   wherein the second operational amplifier for receiving the capacitor voltage and for providing a negative feedback to the source of the second field effect transistor so that the gate to source voltage of the first field effect transistor is substantially equal to the gate to source voltage of the second field effect transistor.

5. The loop filter according to claim 3, wherein the reference precision resistor is adjusted by a multiplexer controlled by n bits.

6. The loop filter according to claim 3, wherein the reference precision resistor is a resistor external to the phase lock loop circuit.

7. The loop filter according to claim 3, wherein the phase lock loop circuit does not contain resistor technology.

8. The loop filter according to claim 3, wherein the first field effect transistor has a same channel length, a same channel width, a multiple of a channel length, or a multiple of a channel width of the second field effect transistor.

9. The loop filter according to claim 3, wherein the first field effect transistor and the second field effect transistor have a reduced area, a lower capacitance, and a higher frequency capability than the reference precision resistor.

10. The loop filter according to claim 3, wherein the first field effect transistor and the second field effect transistor enable the loop filter to increase its tolerances of resistivity and temperature.

11. The loop filter according to claim 1, further comprising:
one or more additional field effect transistors cascoded onto the first field effect transistor to extend a drain to source voltage of the loop filter.

12. A phase lock loop circuit comprising:
a phase frequency detector for determining the phase relationship between a reference signal and a feedback output signal generated by the phase lock loop circuit;
a charge pump connected to the phase frequency detector for generating a current based on the phase relationship between the reference signal and feedback output signal;
a loop filter for generating an averaged control signal from the current provided by the charge pump;
and a voltage controlled oscillator for generating an output signal for the phase lock loop circuit upon receiving the averaged control signal from the loop filter;
wherein the loop filter further comprises:
  a reference precision resistor;
  a reference current supplied to the reference precision resistor to produce a reference voltage;
  a first field effect transistor and a second field effect transistor, wherein a gate of the first field effect transistor is tied to a gate of the second field effect transistor;
  a filter capacitor connected to the first field effect transistor for producing a capacitor voltage;
  a current supplied to a drain of the second field effect transistor to produce a drain voltage; and
  an operational amplifier for receiving the reference voltage and for providing a negative feedback to a gate of the second field effect transistor so that the drain voltage of the second field effect transistor is substantially equal to the reference voltage,
  wherein the capacitor voltage is applied to a source of the first field effect transistor, a source of the second field effect transistor, and to a bottom of the reference precision resistor acting as a virtual ground,
  wherein a drain to source resistance of the second field effect transistor is substantially equal to or is a multiple of a resistance of the reference precision resistor, and
  wherein a gate voltage of the second field effect transistor is applied to a gate of the first field effect transistor to set a bias point of the first field effect transistor such that the first field effect transistor comprises characteristics of an integrated precision resistor.

13. A method for providing a reference precision resistor in a loop filter in a phase lock loop circuit, the method comprising:
providing a reference precision resistor;
providing a first field effect transistor and a second field effect transistor, wherein a gate of the first field effect transistor is tied to a gate of the second field effect transistor;
providing a filter capacitor connected to the first field effect transistor for producing a capacitor voltage; and
applying the capacitor voltage to a source of the first field effect transistor, a source of the second field effect transistor, and to a bottom of the reference precision resistor to act as a virtual ground,
setting a bias point of the second field effect transistor using the capacitor voltage such that the second field effect transistor comprises characteristics of an integrated precision resistor, and
applying a predetermined voltage generated by the second field effect transistor to the gate of the first field effect transistor to set a bias point of the first field effect transistor such that the first field effect transistor comprises characteristics of an integrated precision resistor.

14. The method according to claim 13, wherein the bias point is set such that a drain to source resistance of the first field effect transistor is substantially equal to or is a multiple of a resistance of the reference precision resistor.

15. The method according to claim 13, further comprising:
providing a reference current supplied to the reference precision resistor to produce a reference voltage;
providing a current supplied to a drain of the second field effect transistor to produce a drain voltage; and
providing an operational amplifier for receiving the reference voltage and for providing a negative feedback to the gate of the second field effect transistor so that the drain voltage of the second field effect transistor is substantially equal to the reference voltage,
wherein a drain to source resistance of the second field effect transistor is substantially equal to or is a multiple of a resistance of the reference precision resistor, and
wherein the predetermined voltage applied to the gate of the first field effect transistor to set the bias point of the first field effect transistor is a gate voltage of the second field effect transistor.

16. The method according to claim 15, further comprising:
providing a second operational amplifier,
wherein the filter capacitor provides the capacitor voltage to the second operational amplifier to produce a buffered voltage, wherein the buffered voltage has substantially the same potential as the capacitor voltage; and
wherein the second operational amplifier for receiving the capacitor voltage and for providing a negative feedback to the source of the second field effect transistor so that the gate to source voltage of the first field effect transistor is substantially equal to the gate to source voltage of the second field effect transistor.

17. The method according to claim 15, wherein the phase lock loop circuit does not contain resistor technology.

18. The method according to claim 15, wherein the first field effect transistor has a same channel length, a same channel width, a multiple of a channel length, or a multiple of a channel width of the second field effect transistor.

19. The method according to claim 15, wherein the first field effect transistor and the second field effect transistor have a reduced area, a lower capacitance, and a higher frequency capability than the reference precision resistor.

20. The method according to claim 13, further comprising:
cascoding one or more additional field effect transistors onto the first field effect transistor to extend a drain to source voltage of the loop filter.

* * * * *